United States Patent [19]

McIver

[11] Patent Number: 4,627,084
[45] Date of Patent: Dec. 2, 1986

[54] DIFFERENTIATION AND INTEGRATION UTILIZING CHARGE-COUPLED DEVICES

[75] Inventor: George W. McIver, Redondo Beach, Calif.

[73] Assignee: TRW Inc., Redondo Beach, Calif.

[21] Appl. No.: 315,099

[22] Filed: Oct. 26, 1981

Related U.S. Application Data

[63] Continuation of Ser. No. 94,612, Nov. 15, 1979, abandoned.

[51] Int. Cl.[4] ............... G11C 19/28; H01L 29/78
[52] U.S. Cl. ............................ 377/60; 377/59; 357/24
[58] Field of Search ............ 357/24; 307/221 D; 377/57–63

[56] References Cited

U.S. PATENT DOCUMENTS

| | | | |
|---|---|---|---|
| 3,876,952 | 4/1975 | Weimer | 357/24 LR |
| 4,035,667 | 7/1977 | Heller | 357/24 R |
| 4,071,775 | 1/1978 | Hewes | 357/24 R |
| 4,210,825 | 7/1980 | Crochiere et al. | 357/24 R |
| 4,501,007 | 2/1985 | Jensen | 357/24 R |

OTHER PUBLICATIONS

Tompsett "Charge Transfer Devices", J. Vac. Sci. Technol., vol. 9 (7–8/72) pp. 1166–1181.
Sequin et al, "A Symmetrically Balanced Linear Differential Charge-Splitting Input for Charge-Coupled Devices", IEEE Trans. Electron Devices, vol. ED-24 (6/77) pp. 746–750.

Primary Examiner—Gene M. Munson
Attorney, Agent, or Firm—Noel F. Heal; Donald R. Nyhagen

[57] ABSTRACT

A charge-coupled-device analog input circuit, for generating packets of electrical charge representative of samples of a differentiated analog input signal, and a charge-coupled-device analog output circuit, for generating an analog output signal by a process of integration of the signal values represented by the charge packets. The differentiating input circuit includes a signal input circuit with a relatively large input capacitance, and a separate bias input circuit with a relatively small input capacitance, to generate charge packets at a selected bias level. The integrating output circuit includes a set of bias gates for removing from each packet an amount of charge equal to the bias charge generated at the input circuit, and also includes a feedback loop for adding to each charge packet presented at the output circuit a charge equivalent to the cumulative sum of all signal samples derived by the circuit. The differentiating and integrating circuits can be used in a variety of applications, and provide exceptionally low noise characteristics.

9 Claims, 7 Drawing Figures

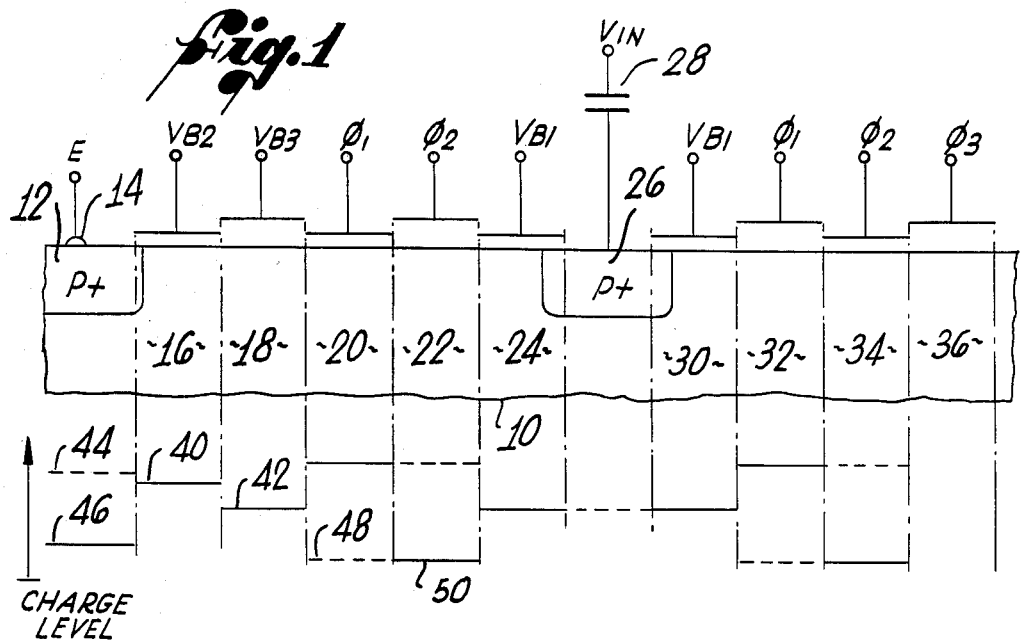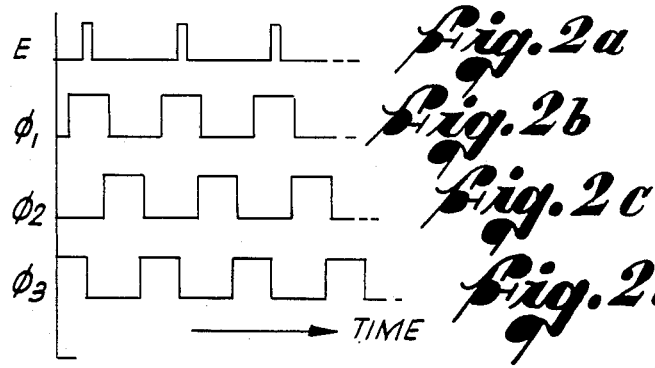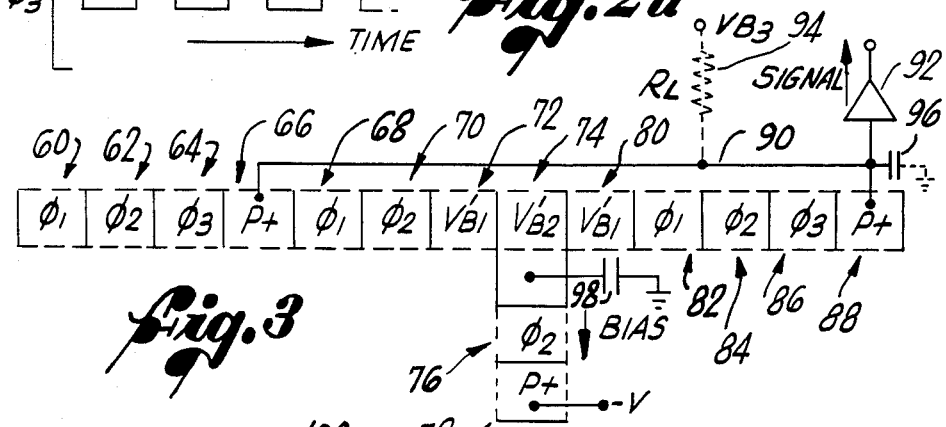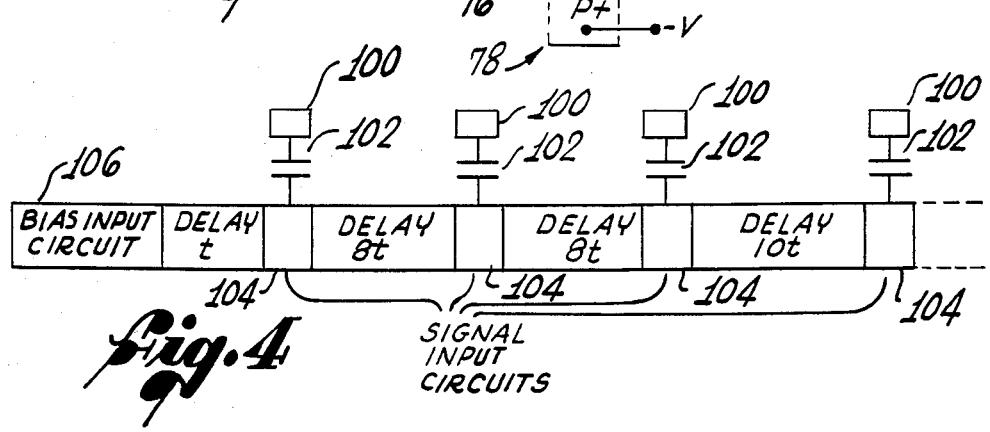

DIFFERENTIATION AND INTEGRATION UTILIZING CHARGE-COUPLED DEVICES

This is a continuation of application Ser. No. 094,612, filed Nov. 15, 1979, now abandoned.

BACKGROUND OF THE INVENTION

This invention relates generally to charge-coupled devices, and, more particularly, to charge-coupled devices of the type used for processing analog signals.

Charge-coupled devices, usually referred to as CCD's, are a specialized form of large-scale integrated circuits that operate by movement and manipulation of units of electrical charge, rather than units of voltage or current, as in conventional integrated circuits and in most other electronic circuits. A gate in a charge-coupled-device consists of an electrode, an insulating layer, usually of silicon dioxide, and a substrate, usually of silicon. If a bias voltage is applied between the CCD gate electrode and the substrate, this creates a "potential well" in a depletion region under the electrode. Then, if minority carriers, either electrons or holes, depending on the doping polarity of the substrate, appear in the silicon substrate near the well, a charge packet will form in the depletion region. If a second, similarly structured gate is disposed adjacent to the first gate, and if the electrode bias voltage on this second gate is made higher than the bias on the first electrode, the packet of charge in the first well will be transferred to the second well.

In analog applications of CCD's, the magnitude of the packet of charge is made directly proportional to the amplitude of the signal being processed. In many analog applications of CCD's, analog data is sampled at a relatively high frequency, such as in video signal processing systems. Typical CCD structures have the form of delay lines or shift registers, in which phased clock signals are used to control the movement of charge packets along one or more strings or channels of CCD gates. Electrical input to such a channel can be effected by means of a p-n junction adjacent to the first gate. If a forward bias signal is applied to this diode, a large number of minority carriers will be made available, and a packet of charge will appear under the first gate. Output signals can be derived by means of a similar p-n diode and a series resistor, provided that the packets of charge are large enough. Otherwise, a more elaborate circuit, possibly utilizing field effect transistors, can be utilized.

When charge-coupled devices are used for relatively low-level analog signal processing, two major problems encountered are the occurrence of input circuit noise and the occurrence of output circuit noise. These two noise sources are so dominant that all other noise contributions are generally negligible. The input referred noise voltage, $e_n$, is of the form $e_n = KT/C_{in}$, where K is the Boltzmann constant, T is the absolute temperature, and $C_{in}$ is the input capacitance of the circuit. This expression leads to a requirement for very large capacitors to achieve desirably low noise levels required by many systems, but the inherent capacitance of typical CCD input circuits is relatively low. Moreover, a larger capacitance can be achieved only at the expense of having larger circuit elements and a correspondingly lower packing density. Accordingly, it is one of the objects of the present invention to provide a CCD structure in which both the input noise and output noise are substantially reduced. As will soon be appreciated, in achieving this objective the invention also provides other important advantages over conventional CCD configurations.

SUMMARY OF THE INVENTION

In accordance with a principal aspect of the present invention, an input signal to a charge-coupled device is differentiated by means of a relatively large capacitor in a signal input circuit. The advantage of this approach is that relatively lower capacitance values can be used in the charge-coupled device, and hence smaller chips can be used to provide the same functions. Moreover, the resulting device has greater tolerance to radiation degradation effects, since the smaller circuit areas can pick up smaller leakage currents, which are a dominant radiation degradation effect for such devices. Even more importantly, the input noise for the signal input differentiation circuit is relatively low, and a plurality of such input circuits can be used in conjunction with a single bias input circuit.

In accordance with another novel aspect of the invention, the input differentiation circuit is utilized in conjunction with an integrating output structure. It will also be appreciated that the differentiation and integration techniques employed in the invention can be utilized in a variety of ways as circuit elements in filters or other analog devices. Therefore, the present invention represents a significant advance in the field of analog signal processing by means of charge coupled devices. In particular, the invention teaches the use of differentiation and integration techniques not previously employed with these devices, and thereby provides an inherently low-noise circuit for analog signal processing. Other aspects and advantages of the invention will become apparent from the following more detailed description, taken in conjunction with the accompanying drawings.

BRIEF DESCRIPTION OF THE DRAWINGS

FIG. 1 is a diagrammatic elevational view of an input circuit of a charge-coupled device utilizing the differentiation techniques of the invention, together with an accompanying depiction of the relative energy levels at various gates in the device;

FIGS. 2a–2d are timing diagrams showing clock signals used to control the operation of the input circuit shown in FIG. 1;

FIG. 3 is a diagrammatic plan view of an integrating output circuit for a charge-coupled device, which may be used in conjunction with the input circuit shown in FIG. 1; and FIG. 4 is a simplified diagrammatic view of a charge-coupled device providing inherently low input noise in the processing of multiple input signals in a time delay and integration circuit.

DESCRIPTION OF THE PREFERRED EMBODIMENTS

As shown in the drawings for purposes of illustration, the present invention is principally concerned with charge-coupled-devices for processing analog signals. In accordance with one aspect of the invention, a charge-coupled-device is provided with a differentiating signal input circuit, which may be used to substantially reduce input circuit noise. In accordance with another aspect of the invention, the charge-coupled-device is provided with an integrating output circuit. In addition to reducing input circuit noise and output circuit noise, the differentiating and integrating circuits may be used as differentiating and integrating elements in filters and similar structures utilizing charge-coupled-devices.

FIG. 1 shows the differentiating input circuit of the invention. As shown, a charge-coupled-device includes an underlying semiconductor substrate, indicated by reference numberal 10, and typically made of silicon, an insulator layer (not shown) over the substrate, and a number of electrodes disposed over of the insulator layer. Each electrode, and the portion of the device immediately beneath it is referred to as a gate. Basically, each gate is electrically equivalent to a pair of capacitors, one of which may be thought of as a conventional capacitor having the insulator layer as a dielectric, and the other of which is a depletion capacitor formed in the region of the substrate immediately below the electrode. When a voltage is applied between the electrode and the substrate, a depletion region or "well" is formed in the substrate beneath the electrode, and the depth of the well increases with the voltage applied between the electrode and the substrate. If minority charge carriers appear in the silicon substrate near the well, a charge packet will form in the well, or depletion region. This charge packet can be transferred from one gate to an adjacent gate by applying an appropriate voltage to the elctrode of the adjacent gate, such that the well in the adjacent gate is deeper than the well in the gate in which the charge packet presently resides. By means of appropriate timing signals applied to the electrodes, a charge packet or packets can be made to progress along a succession of CCD gates in a device.

In the input circuit shown in FIG. 1, there is a bias input circuit comprising a p+ diffused semiconductor region, indicated by reference numeral 12, to which an input electrode 14 is attached, and two CCD gates 16 and 18 to which bias voltages $V_{B2}$ and $V_{B3}$ are applied. It will be appreciated that the diffused region 12 is indicated as being doped to form a p+ type material only by way of example. As in other semiconductor structures, materials of opposite polarity type could be interchanged and the voltage polarities appropriately reversed.

The gate 16 is adjacent to the p+ diffused region 12, and the gate 18 is immediately adjacent to the gate 16. Adjacent to gate 18 is a phase-one clocking gate 20, and adjacent to it is a phase-two clocking gate 22. The terms phase-one, phase-two and phase-three clocking signals refer to the signals whose waveforms are shown in FIGS. 2b, 2c and 2d, respectively. Next to the clocking gate 22 is an isolation gate 24, next to which is a diffused signal input region 26, by means of which an analog signal $V_{IN}$ is introduced thorugh a capacitor 28. On the other side of the signal input region 26 is another isolation gate 30. Next, there are phase-one, phase-two and phase-three clocking gates 32, 24 and 36, respectively.

The function of this input circuit is to sample a varying analog signal, and to provide a corresponding succession of packets of electrical charge for propagation along a sequence of gates in the device. Since the signal to be sampled, or the differential of the signal, may assume both positive and negative values, it is typical in CCD input circuits to impress a bias value on the charge packets. In the circuit shown in FIG. 1, this is achieved by means of the bias gates 16 and 18 operating in conjunction with a timing signal E, applied to the input electrode 14. The signal E is a timing signal controlling the injection of charge into the bias input circuit and, as shown in FIGS. 2a-2d, the signal E is synchronized with other clocking signals controlling the rate of operation of the device. The energy levels corresponding to the bias voltages on gates 16 and 18 are as shown at 40 and 42, respectively, and when the timing signal E rises to its maximum value, the wells associated with gates 16 and 18 are effectively charged to the level indicated by the broken line 44. When the timing signal E falls to zero again, the energy level falls to that indicated by line 46, and charge is, in essence, spilled out of gate 16, leaving a residual charge in gate 18 that is proportional to the voltage difference between the applied voltages $V_{B2}$ and $V_{B3}$, and also proportional to the inherent capacitance associated with gate 18.

It was typical in charge-coupled-device input circuits of the prior art to apply a single bias voltage to gate 16, and to apply a varying signal voltage to gate 18, so that the difference between the bias and signal voltages was utilized to regulate the amount of charge injected into the device. However, the input capacitance associated with desirably small CCD gate of this type is relatively low, and the arrangement gives rise to correspondingly high input noise levels, which are, of course, undesirable. As will shortly be appreciated, the use of a separate bias input circuit with low capacitance, and an independent signal input circuit with high capacitance reduces the input noise substantially.

After a bias charge packet has been introduced into gate 18 as described above, it is transferred to gate 20 when the phase-one clocking signal shown in FIG. 2b goes to a high state, as indicated by the energy level 48. Then, the charge packet is next transferred to gate 22, when the phase-two clocking signal of FIG. 2c goes to a high state, as indicated by energy level 50. When the phase-two clocking signal subsequently falls, the charge packet is next transferred to the first isolation gate 24. Thereafter, it will be either reduced or increased in charge or energy level by the effect of the input signal applied to the diffused signal input region 26. It is important to note that if the input voltage $V_{in}$ does not vary, there will be no change in the total electrical charge in the charge packet as it mores from the first islotion gate 24 to the second isolation gate 30. In effect, the capacitor 28 functions to differentiate the incoming voltage signal $V_{in}$. The change in voltage multiplied by the value of the capacitance 28 gives the amount of electrical charge by which the bias charge packet will be changed or modulated as it progresses from isolation gate 24 to isolation gate 30. Once this modulated charge packet reaches isolation gate 30, it is thereafter shifted through clocking gates 32, 34 and 36 in a conventional manner. More specifically, when the phase-one clocking signal goes high the charge packet is transferred into gate 32. Then, when the phase-one clocking signal goes low and the phase-two clocking signal goes high, the charge packet is transferred into gate 34, and so forth.

The corresponding integrating structure at the output of a charge-coupled-device is shown in FIG. 3. This is shown in plan view, in order to illustrate a bias extraction circuit requiring a branch CCD channel. As shown in the figure, charge packets, equivalent to a signal and a bias value together, are propagated from left to right into the output circuit, through three clocking gates, a phase-one gate 60, a phase-two gate 62, and a phase-three gate 64, all shown at the left of the figure. Adjacent to the phase-three gate 64 is a diffusion region 66, and next to it in succession are a phase-one gate 68 and a phase-two gate 70. Next to the phase-two gate 70 is a bias gate 72 to which a voltage $V'_{B1}$ is applied, and next to it is a further bias gate 74 to which a voltage $V'_{B2}$ is applied. At this point, the CCD device bifurcates into two channels, one being shown in a downward direction in the firgure, and one continuing in the right-hand direction. As shown, the downwardly directed channel has a phase-two gate 76 next to the bias gate 74, and then has a diffusion region 78 to which a negative voltage is applied for extraction of the bias signal. The other CCD channel includes another bias gate 80 next to the bias gate 74, for application of bias voltage $V'_{B1}$, three clocking gates 82, 84 and 86, followed by a final diffusion region 88. The diffusion regions 88 and 66 are connected by a metal conductor, indicated at 90, and the output signal from the device is derived from this conductor as indicated by the amplifier 92. A load resistance is indicated at 94, and a load capacitance at 96. The load capacitance 96 converts the integrated signal charge to voltage. The load resistance 94 represents the parasitic charge loss mechanism of practical circuits.

In operation, the output circuit propagates charge packets from left to right through the clocking gates 60, 62 and 64. Each charge packet is further augmented in the diffusion region 66 by an electrical charge equivalent to the sum of the signal samples over the period of operation of the device supplied through conductor 90. This summed signal is then further propagated as a charge packet through the gates 68 and 70 and into gates 72 and 74. When the phase-two clock signal falls to a low value, a charge packet is transferred into gates 72, 74 and 80. When the phase-one clock signal next goes high, prt of the charge packet in gates 72, 74 and 80 is transferred into gate 82, but a remaining portion, proportional to the difference between the bias voltages $V'_{B1}$ and $V'_{B20}$ remains in the $V'_{20}$ gate 74. When the phase-two clock signal subsequently rises in value again, the remaining charge, equivalent to the difference between the voltages $V'_{B1}$ and $V'_{B2}$ multiplied by the value of the inherent capacitance of the bias gate 74, indicated at 98, is transferred into gate 76. When the phase-two clock signal next falls, this charge packet is withdrawn from the device by means of the negative voltage applied to the diffusion region 78. It can easily be arranged that the bias charge removed in each such cycle is equivalent to the bias charge added at the input device shown in FIG. 1. This will hold true if the difference between the bias voltages $V_{B2}$ and $V_{B3}$ multiplied by the inherent capacitance of gate 18 in FIG. 1 is equal to the difference in bias voltages $V'_{B1}$ and $V'_{B2}$ multiplied by the inherent capacitance of the gate 74.

The charge packet transferred from bias gate 80 to the phase-one gate 82 when the phase-one clock signal rises, represents a bias-free signal. This packet will be transferred next to gate 84, then to gate 86, and then removed from the device through the diffusion region 88, to be inserted in region 62 via conductor 90. The electrical signal thus derived on line 90 is equivalent in value to the sum for all time of the input signal samples. (Practical charge loss represented by load resistance 94 limits the practical sum time to about several seconds.) It will be recalled, however, that the input signal samples may be derived from a differentiated form of an analog input signal, so that this integration process on output can be used to recreate an original analog input signal.

One application of the principles of this invention is, as shown in FIG. 4 a time delay and integration circuit sometimes used in the processing of signals from optical signal detectors. In this application, an image is moving with respect to a plurality of transducers, indicated by reference numeral 100. Each transducer 100 is connected to provide a signal to a corresponding capacitor 102, which is, in turn, connected to a corresponding signal input circuit 104 in a charge-coupled-device. A bias input circuit 106 is used to generate packets of charge at a selected bias level. The charge packets are subject to a first delay before reaching the first signal input circuit, and then to subsequent delays between signal input circuits, each of the delays being equivalent to the delays involved in the translation of the image past the corresponding transducers 100. In the example shown, the first two delays are shown as 8t, i.e., eight times the delay of one sample-time for the device, and the third delay time is shown as 10t, in which case there would be a 10t delay in the translation time from one transducer to the next. Each of the signal input circuits 104 is a differentiating input circuit similar to the one shown in FIG. 1. Since these are inherently low-noise circuits, the overall circuit noise is substantially less than would be obtained if conventional signal inputs were used without differentiation. The configuration of FIG. 4 would also typically include an integration circuit like that shown in FIG. 3, to provide an output signal proportional to the input signal, rather than to its differential.

It will be appreciated from the foregoing that the present invention represents a significant advance in the field of charge-coupled-devices for processing analog signals. In particular, the invention provides a differentiating input circuit and an integrating output circuit that may be applied in a wide variety of CCD analog applications, such as filters, and may also be employed to substantially reduce noise in many CCD applications. It will also be appreciated, that although specific embodiments of the invention have been described for purposes of illustration, various modifications may be made without departing from the spirit and scope of the invention. Accordingly, the invention is not to be limited except as by the appended claims.

I claim:

1. A differentiating input circuit for a charge-coupled device (CCD), said circuit comprising:

a semiconductor substrate;

bias input circuit means integrated into said substrate, for generating a succession of packets of electrical charge, each with the same charge level, proportional to a bias voltage;

means for propagating the charge packets along a channel of the CCD in a periodic manner;

a capacitive signal input circuit;

analog signal input means also integrated into said substrate, for modulating the charge level of the charge packets in accordance with the time differential of a periodically sampled analog input signal, to provide a succession of charge packets of which the charge level is proportional to the sum of the bias voltage and the difference between the currently sampled value of the analog input signal voltage and the previously sampled value of the input signal voltage;

said analog signal input means including a charge exchange region to which the input signal is connected through said capacitive input circuit, CCD gate means biased to a desired reference charge level, for cooperating with said charge exchange region in such a manner that the desired reference charge is increased by the amount of charge in one of the bais charge packets, is further modulated by an increment of charge proportional to the difference between the currently sampled and previously sampled values of the analog input signal, and is returned to the reference charge level when the modulated charge packet is removed from said CCD gate means;

at least one additional analog input signal means integrated into said substrate; and at least one sequence of clocked CCD gates integrated into said substrate separating said analog input signal means, whereby multiple analog input signals are introduced at points spaced along the CCD channel, and only a single bias input circuit means is needed, thereby reducing input noise substantially.

2. An integrating output circuit for a charge-coupled device (CCD), said circuit comprising:

means for propagating a succession of charge packets containing a charge level proportional to the sum of a bias voltage and an analog signal voltage;

means for augmenting the charge of each charge packet presented to said output circuit by an amount proportional to the accumulated sum of all prior signal values presented to said circuit;

bias extraction circuit means for removing from each charge packet s preselected quantity of charge proportional to a bias voltage, leaving an output charge level in each packet proportional to a new accumulated sum of analog signal components only, and therefore proportional to the time integral of the signal presented to said integrating output circuit;

a semiconductor substrate into which all of said foregoing means are integrated;

output means for converting the output charge level to an electrical output signal; and feedback circuit means for connecting the output signal to said means for augmenting charge.

3. An integrating output circuit for a charge-coupled device (CCD), said circuit comprising:

means for propagating a succession of charge packets containing a charge level proportional to the sum of a bias voltage and an analog signal voltage;

means for augmenting the charge of each charge packet presented to said output circuit by an amount proportional to the accumulated sum of all prior signal values presented to said circuit;

bias extraction circuit means for removing from each charge packet a preselected quantity of charge proportional to a bias voltage, leaving a charge level in each packet proportional to a new accumulated sum of analog signal components only, and therefore proportional to the time integral of the signal presented to said integrating output circuit;

a semiconductor substrate into which all of said foregoing means are integrated;

wherein said means for augmenting the charge of each charge packet includes a charge output region having an electrical contact for removal of charge packets from said circuit, electrical conductor means connected to said electrical contact in said charge output region, and a charge input region having an electrical contact connected to said electrical conductor means for re-inputting charge packets and combining each such charge packet with a charge packet presented to said output circuit, to produce a combined charge packet having a signal component proportional to the cumulative sum of all signal components presented to said output circuit.

4. An integrating output circuit for a charge-coupled device (CCD), said circuit comprising:

means for propagating a succession of charge packets containing a charge level proportional to the sum of a bias voltage and an analog signal voltage;

means for augmenting the charge of each charge packet presented to said output circuit by an amount proportional to the accumulated sum of all prior signal values presented to said circuit;

bias extraction circuit means for removing from each charge packet a preselected quantity of charge proportional to a bias voltage, leaving a charge level in each packet proportional to a new accumulated sum of analog signal components only, and therefore proportional to the time integral of the signal presented to said integrating output circuit;

a semiconductor substrate into which all of said foregoing means are integrated;

wherein said bias extraction circuit means includes first, second and third CCD bias gates, said first and third bias gates having electrodes biased to a first selected level and said second bias gate being located between said first and third gates and having an electrode biased to a second selected level;

and wherein said means for propagating charge packets includes a first timing gate for introducing into said bias gates, charge packets proportional to signal and bias together, a second timing gate, for inserting into said bias gate, charge packets proportional to previously accumulated signal only, and a third timing gate, for removing from said bias gates charge packets proportional to bias only;

and wherein said bias extraction circuit means further includes a charge removal region adjacent to said third timing gate, for removing from said output circuit packets of charge proportional to bias only.

5. An integrating output circuit as set forth in claim 4, wherein:

said first timing gate is first operative to deliver a charge packet into said three bias gates;

said first timing gate is next operative to remove from said bias gates all of the charge packet except a portion that remains in said second bias gate and is proportional to the difference between the bias voltage applied to said second bias gate and the bias voltage applied to said first and third bias gates; and said third timing gate is next operative to remove from said second bias gate the remaining portion of the charge packet.

6. An integrating output circuit as set forth in claim 4 or 5, wherein said means for augmenting the charge of each charge packet includes:

a charge output region having an electrical contact for removal of charge packets from said circuit;

electrical conductor means connected to said electrical contact in said charge output region; and a charge input region having an electrical contact connected to said electrical conductor means for re-inputting charge packets and combining each such charge packet with a charge packet presented to said output circuit, to produce a combined charge packet having a signal component proportional to the cumulative sum of all signal components presented to said output circuit.

7. An integrating output circuit as set forth in claim 6 or 3, wherein:
said bias extraction circuit means is located between said charge input region and said charge output region; and
said charge input region is operative to add a charge packet proportional to the cumulative sum of all signal components to a charge packet proportional to the sum of a bias value and a single signal sample value.

8. An integrating output circuit for a charge-coupled device (CCD), said circuit comprising:
a semiconductor substrate;
a sequence of clocked CCD gates integrated into said substrate, for presenting to said circuit a succession of charge packets, each having a charge level proportional to the sum of a bias level and a signal sample level;
a first diffusion region in said substrate, for adding to each packet a charge value proportional to the cumulative sum of all signal components derived by said output circuit;
a second sequence of clocked CCD gates integrated into said substrate, for transferring charge packets from said first diffusion region;
first, second and third CCD bias gates located in said substrate to receive charge packets from said second sequence of clocked gates, said first and third bias gates having electrodes biased to a first selected level and said second bias gate having an electrode biased to a second selected level;
at least one additional clocked CCD gate in said substrate, for transferring from said bias gates a portion of each charge packet proportional to a cumulative signal component;
at least one further additional clocked CCD gate in said substrate, for transferring from said bias gates a remaining portion of each charge packet proportional to a bias level determined by the difference between said first and second selected bias levels;
a second diffusion region in said substrate, for removing the portion of each charge packet proportional to bias level;
a third diffusion region in said substrate, for removing the portion of each charge packet proportional to the cumulative signal component, and for thereby providing an output signal; and
conductive means connecting said first and third diffusion regions, to feed back to said first diffusion region a sequence of charge packets proportional to the cumulative signal component.

9. A charge-coupled device, comprising:
a semiconductor substrate;
a differentiating input circuit integrated into said substrate and having
bias input circuit means, for generating a succession of packets of electrical charge, each with the same charge level, proportional to a bias voltage,
a capacitive signal input circuit,
analog signal input means, for modulating the charge level of the charge packets in accordance with the time differential of a periodically sampled analog input signal, to provide a succession of charge packets of which the charge level is proportional to the sum of the bias voltage and the difference between the currently sampled value of the analog input signal voltage and the previously sampled value of the analog input signal voltage, said analog signal input means including CCD gate means biased to a desired reference charge level, and a charge exchange region to which the input signal is connected through said capacitive input circuit, and
means for propagating the charge packets along a channel of a charge-coupled device; and
an integrating output circuit integrated into said substrate and having
means for augmenting the charge of each charge packet presented to said output circuit by an amount proportional to the accumulated sum of all prior signal values presented to said circuit, and
bias extraction circuit means for removing from each charge packet a preselected quantity of charge proportional to a bias voltage, leaving a charge level in each packet proportional to a new accumulated sum of analog signal components only.

* * * * *